US010411606B2

(12) United States Patent
Oshima

(10) Patent No.: US 10,411,606 B2
(45) Date of Patent: Sep. 10, 2019

(54) POWER SUPPLY APPARATUS AND IMAGE FORMING APPARATUS

(71) Applicant: CANON KABUSHIKI KAISHA, Tokyo (JP)

(72) Inventor: Mitsunori Oshima, Suntou-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/168,485

(22) Filed: Oct. 23, 2018

(65) Prior Publication Data
US 2019/0131879 A1 May 2, 2019

(30) Foreign Application Priority Data

Oct. 30, 2017 (JP) ................................ 2017-209347

(51) Int. Cl.
H02M 3/335 (2006.01)
G03G 15/00 (2006.01)
G01R 19/165 (2006.01)
H02M 1/32 (2007.01)
H02M 3/156 (2006.01)

(52) U.S. Cl.
CPC .. *H02M 3/33515* (2013.01); *G01R 19/16547* (2013.01); *G03G 15/5004* (2013.01); *H02M 1/32* (2013.01); *H02M 3/156* (2013.01)

(58) Field of Classification Search
CPC ........ H02M 1/32; H02M 3/156; H02M 3/158; H02M 3/335; H02M 3/33515
See application file for complete search history.

(56) References Cited

U.S. PATENT DOCUMENTS

| 7,245,510 | B2 | 7/2007 | Baurle |
| 7,365,996 | B2* | 4/2008 | Schonleitner ........... H02M 1/36 363/20 |
| 7,405,954 | B2 | 7/2008 | Baurle |
| 7,518,889 | B2 | 4/2009 | Baurle |
| 7,859,865 | B2 | 12/2010 | Baurle |
| 8,199,538 | B2* | 6/2012 | Piper ................. H02M 3/33507 363/21.13 |
| 2007/0008749 | A1 | 1/2007 | Baurle |
| 2007/0242488 | A1 | 10/2007 | Baurle |
| 2008/0259653 | A1 | 10/2008 | Baurle |

(Continued)

FOREIGN PATENT DOCUMENTS

JP 2007-20392 1/2007

*Primary Examiner* — Matthew V Nguyen
(74) *Attorney, Agent, or Firm* — Venable LLP

(57) ABSTRACT

The power supply apparatus includes a control unit to control an operation of a first switching element based on a feedback voltage and a voltage of an auxiliary winding of a transformer detected by a voltage detection unit. In a state where the voltage detected by the voltage detection unit is equal to or more than a first threshold voltage, the control unit shifts to a first state where the first switching element is controlled so that the output voltage is to be a first output voltage based on the feedback voltage. In a state where the voltage detected by the voltage detection unit is less than a second threshold voltage smaller than the first threshold voltage, the control unit shifts to a second state where the first switching element is controlled so that the output voltage is to be a second output voltage smaller than the first output voltage.

14 Claims, 9 Drawing Sheets

(56) References Cited

U.S. PATENT DOCUMENTS

| | | |
|---|---|---|
| 2009/0251931 A1 | 10/2009 | Baurle |
| 2012/0140530 A1* | 6/2012 | Nemoto .............. H02M 3/3385 |
| | | 363/21.12 |
| 2014/0078790 A1* | 3/2014 | Lin ................... H02M 3/33507 |
| | | 363/21.16 |
| 2015/0009717 A1* | 1/2015 | Chen ................ H02M 3/33507 |
| | | 363/21.02 |
| 2016/0241149 A1* | 8/2016 | Chen ....................... H02M 1/36 |
| 2018/0323717 A1* | 11/2018 | Chang .............. H02M 3/33515 |

* cited by examiner

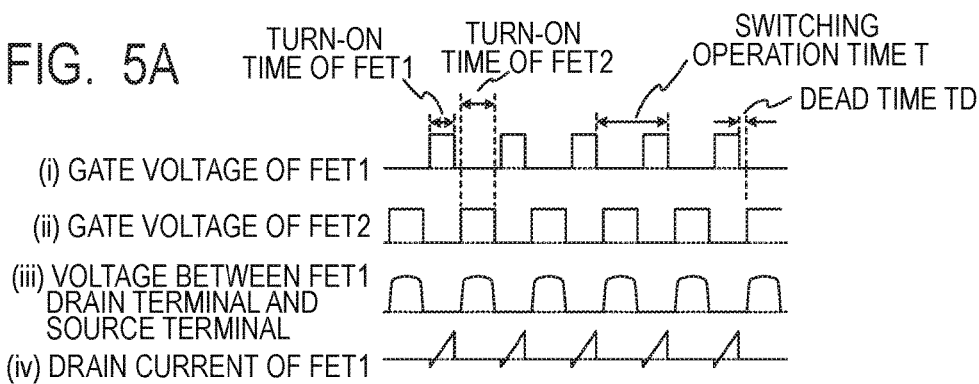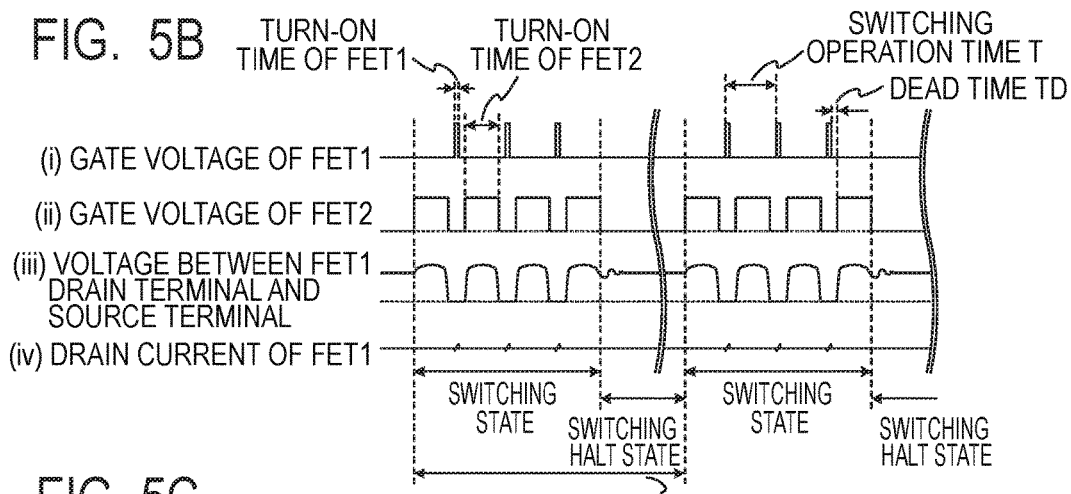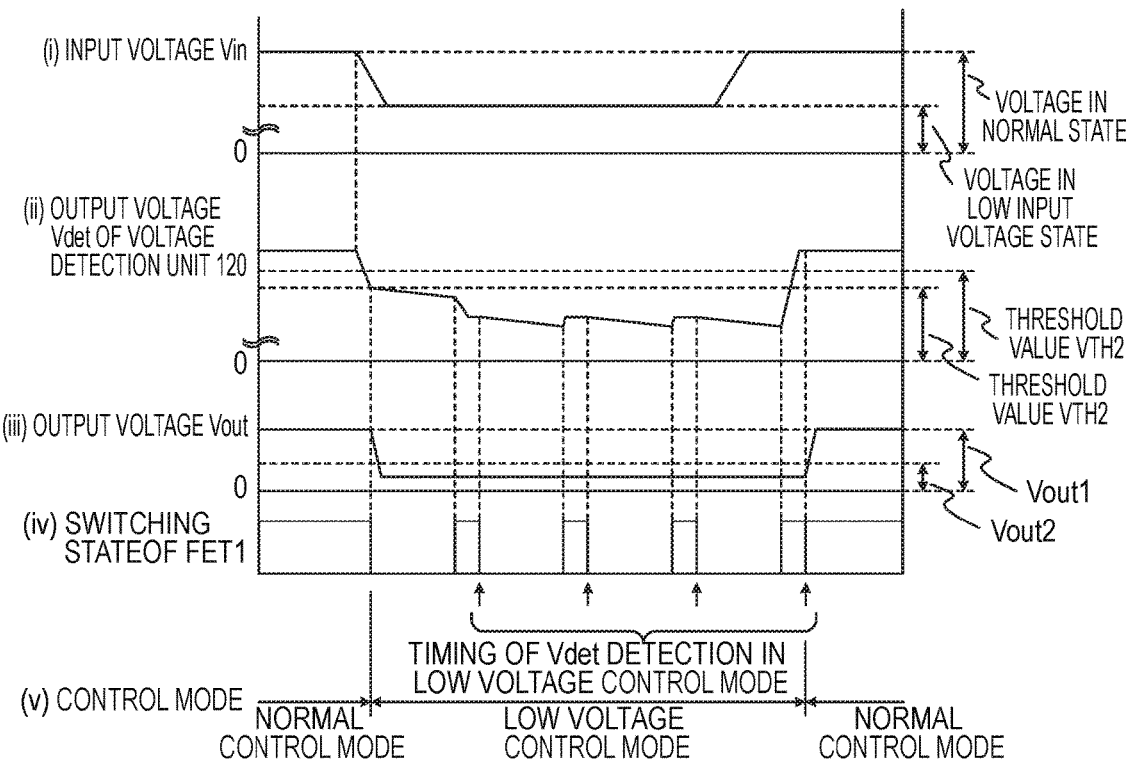

POWER SUPPLY APPARATUS AND IMAGE FORMING APPARATUS

BACKGROUND OF THE INVENTION

Field of the Invention

The present invention relates to a power supply apparatus which uses an insulation transformer, and to an image forming apparatus, and particularly relates to control performed when an abnormal input voltage is applied.

Description of the Related Art

In a switching power supply for converting an AC voltage inputted from a commercial AC power supply or the like to a DC voltage, when a low AC voltage falling outside the rated range is inputted from the commercial AC power supply, failure may occur, or a DC voltage may not be normally outputted. For example, when a switching power supply is started up in a state where an input voltage is lower than a predetermined voltage and, thereafter, a load on the output side of the switching power supply becomes large, power cannot be supplied to the load so that the switching power supply may be halted again. Further, when the switching power supply repeats a start-up state and a halt state, a CPU and the like of the load to which power is supplied from the switching power supply may be erroneously operated. To prevent the occurrence of such a state, Japanese Patent Application Laid-Open No. 2007-20392 proposes a method where outputting of a switching power supply is halted using a low voltage detection circuit when an input voltage is low.

By providing the low voltage detection circuit to the switching power supply, outputting of the switching power supply can be halted when a low input voltage is detected. However, with the provision of the low voltage detection circuit, a problem may occur where power consumption of the switching power supply increases. Increasing the impedance of the low voltage detection circuit allows power consumption of the low voltage detection circuit to be reduced. However, increasing the impedance increases a time constant and, as a result, a problem may occur where responsiveness of the low voltage detection circuit is lowered in detecting a voltage.

SUMMARY OF THE INVENTION

An aspect of the present invention is directed to a power supply apparatus where failure or a defect can be prevented when an input voltage is low and, at the same time, power consumption of a low voltage detection circuit can be reduced, and responsiveness in detecting a voltage can be improved.

Another aspect of the present invention is directed to a power supply apparatus including a rectifying and smoothing unit configured to rectify and smooth an AC voltage from an AC power supply to generate an input voltage, a transformer including a primary winding, a secondary winding, and an auxiliary winding to which the input voltage is supplied, a first switching element connected to the primary winding of the transformer, a feedback unit configured to output a feedback voltage corresponding to an output voltage induced in the secondary winding of the transformer, a voltage detection unit configured to detect a voltage corresponding to a voltage induced in the auxiliary winding of the transformer, and a control unit configured to perform control of an operation of the first switching element based on the feedback voltage and the voltage detected by the voltage detection unit, thus controlling the output voltage, wherein in a state where the voltage detected by the voltage detection unit is equal to or more than a first threshold voltage, the control unit shifts an operation to a first state where the control unit performs control of the first switching element so that the output voltage is to be a first output voltage based on the feedback voltage, and in a state where a voltage value of the AC power supply detected by the voltage detection unit is less than a second threshold voltage smaller than the first threshold voltage, the control unit shifts to a second state where the control unit performs control of the first switching element so that the output voltage is to be a second output voltage smaller than the first output voltage.

A further aspect of the present invention is directed to an image forming apparatus including an image forming unit configured to perform image forming on a recording material, and a power supply apparatus configured to supply power to the image forming apparatus, wherein the power supply apparatus includes a rectifying and smoothing unit configured to rectify and smooth an AC voltage from an AC power supply to generate an input voltage, a transformer including a primary winding, a secondary winding, and an auxiliary winding to which the input voltage is supplied, a first switching element connected to the primary winding of the transformer, a feedback unit configured to output a feedback voltage which corresponds to an output voltage induced in the secondary winding of the transformer, a voltage detection unit configured to detect a voltage corresponding to a voltage induced in the auxiliary winding of the transformer, and a control unit configured to perform control of an operation of the first switching element based on the feedback voltage and the voltage detected by the voltage detection unit, thus controlling the output voltage, wherein in a state where the voltage detected by the voltage detection unit is equal to or more than a first threshold voltage, the control unit shifts to a first state where the control unit performs control of the first switching element, based on the feedback voltage, so that the output voltage is to be a first output voltage, and in a state where a voltage value of the AC power supply detected by the voltage detection unit is less than a second threshold voltage smaller than the first threshold voltage, the control unit shifts to a second state where the control unit performs control of the first switching element so that the output voltage is to be a second output voltage smaller than the first output voltage.

Further features of the present invention will become apparent from the following description of exemplary embodiments with reference to the attached drawings.

BRIEF DESCRIPTION OF THE DRAWINGS

FIG. 5A, FIG. 5B and FIG. 5C are timing charts for describing control of the switching power supply of the embodiment 2.

DESCRIPTION OF THE EMBODIMENTS

Preferred embodiments of the present invention will now be described in detail in accordance with the accompanying drawings.

[Configuration of Switching Power Supply]

Figure 1A:
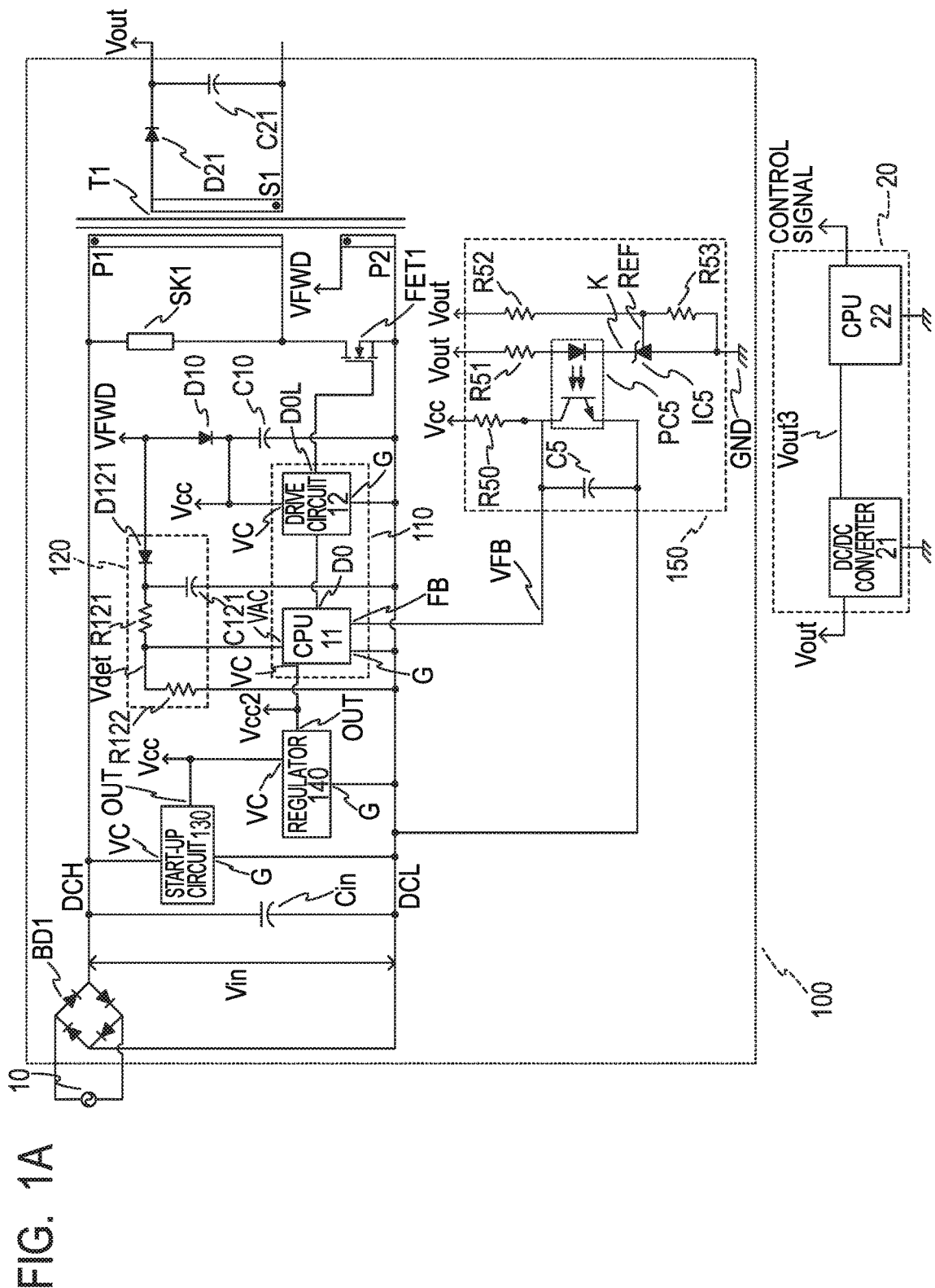
FIG. 1A is a circuit diagram showing a configuration of a switching power supply of an embodiment 1.

FIG. 1A is a circuit diagram showing a configuration of a switching power supply 100 of an embodiment 1. An AC voltage is inputted into the switching power supply 100 from an AC power supply 10 formed of a commercial power supply. The AC voltage is rectified and smoothed by a bridge diode BD1 and a smoothing capacitor Cin, which form a rectifying and smoothing means, so that an input voltage Vin is generated. A low potential side of the capacitor Cin is assumed as DCL, and a high potential side of the capacitor Cin is assumed as DCH. In the switching power supply 100, the input voltage Vin charging the capacitor Cin is inputted into a primary side of a transformer T1, and an output voltage Vout is outputted to a secondary side of the insulated transformer T1. The switching power supply 100 is controlled so that the voltage value of the output voltage Vout is to be a constant voltage, for example, to allow the voltage value of the output voltage Vout to assume a voltage Vout1 (first output voltage), which is a predetermined voltage, in a normal operation state. When the switching power supply 100 of this embodiment is in a normal operation state, the voltage Vout1 is set to 5 V, for example.

The output voltage Vout of the switching power supply 100 is supplied to a control unit 20 of an apparatus (not shown in the drawing) on which the switching power supply 100, forming a load, is mounted. The control unit 20 is formed of a DC/DC converter 21 and a CPU 22. The CPU 22 outputs a control signal to perform control of the apparatus (not shown in the drawing) on which the switching power supply 100 is mounted. The DC/DC converter 21 is a switching power supply which generates a power supply voltage Vout3 (also referred to as "output voltage Vout3") from the output voltage Vout supplied from the switching power supply 100, and which supplies the power supply voltage Vout3 to the CPU 22. In this embodiment, the voltage of the power supply voltage Vout3 is set to 3.3 V, for example. The DC/DC converter 21 is a step-down converter. When the voltage value of the output voltage Vout outputted from the switching power supply 100 is equal to or less than the power supply voltage Vout3, outputting of the power supply voltage Vout3 to the CPU 22 is halted.

Next, a circuit configuration of the switching power supply 100 is described. The switching power supply 100 includes the insulating transformer T1. On the primary side of the transformer T1, the switching power supply 100 includes the following components besides the above-mentioned bridge diode BD1 and smoothing capacitor Cin. That is, the switching power supply 100 includes a field effect transistor (hereinafter, referred to as FET) 1 which forms a first switching element, a power supply control unit 110, a voltage detection unit 120, a start-up circuit 130, a regulator 140, and a feedback unit 150. An SK1 connected in parallel to a primary winding of the transformer T1 is a voltage clamp circuit formed of a diode and the like, for example.

On the other hand, on the secondary side of the transformer T1, the switching power supply 100 includes a diode D21 and a capacitor C21 which perform rectifying and smoothing of the output voltage of the transformer T1.

The flyback transformer T1 includes a primary winding P1, an auxiliary winding P2, and a secondary winding S1. Energy is supplied to the secondary winding S1 from the primary winding P1 of the transformer T1 with the switching operation of the FET 1 described later. A forward voltage VFWD induced in the auxiliary winding P2 is supplied to the voltage detection unit 120. Further, the forward voltage VFWD is rectified and smoothed by a diode D10 and a capacitor C10, which form a rectifying and smoothing means, and is supplied to the power supply control unit 110 and the regulator 140 as a power supply voltage Vcc.

The power supply control unit 110 is a circuit for controlling the FET 1. The power supply control unit 110 is formed of a CPU 11 and a drive circuit 12. The CPU 11 is a one-chip microcomputer including a calculation unit which is operated in response to a clock signal. The CPU 11 detects an output voltage Vdet outputted from the voltage detection unit 120, and a feedback voltage VFB (hereinafter referred to as "voltage VFB") outputted from the feedback unit 150, and the CPU 11 outputs a control signal D0, which is a PWM signal, to the drive circuit 12 based on a detection result. The drive circuit 12 is a circuit which generates, in response to the control signal D0 outputted from the CPU 11, a drive signal DOL to be outputted to a gate terminal of the FET 1. The power supply voltage Vcc is supplied to a VC terminal of the drive circuit 12. When the control signal D0 from the CPU 11 is at a high level, the drive circuit 12 outputs a drive signal DOL of high level to the gate terminal of the FET 1 and hence, the FET 1 is brought into an ON state. On the other hand, when the control signal D0 from the CPU 11 is at a low level, the drive circuit 12 outputs a drive signal DOL of low level to the gate terminal of the FET 1 and hence, the FET 1 is brought into an OFF state.

The voltage detection unit 120 is a circuit which rectifies and smooths a forward voltage VFWD induced in the auxiliary winding P2, and which outputs a voltage Vdet, which is resistively divided, to the CPU 11. The voltage detection unit 120 is formed of a diode D121 and a capacitor C121 for rectifying and smoothing the forward voltage VFWD, and voltage dividing resistors R121, R122 which divide the forward voltage VFWD. The forward voltage VFWD can be expressed by the following (formula 1) using an input voltage Vin generated at both ends of the capacitor Cin, the number of windings N1 of the primary winding P1 of the transformer T1, and the number of windings N2 of the auxiliary winding P2.

$$VFWD = (N2/N1) \times Vin \qquad \text{(formula 1)}$$

The voltage detection unit 120 outputs, to the CPU 11, the voltage Vdet which is obtained by dividing the voltage, obtained by rectifying and smoothing the forward voltage VFWD, by the voltage dividing resistors R121, R122. The number of windings N1 of the primary winding P1, the number of windings N2 of the auxiliary winding P2, and resistance values of the voltage dividing resistors R121, R122 are set in advance. Accordingly, the CPU 11 can detect the voltage value of the input voltage Vin from the voltage value of the voltage Vdet.

The start-up circuit 130 is a three-terminal regulator or a step-down type switching power supply. The start-up circuit 130 generates a power supply voltage Vcc from the input voltage Vin of the switching power supply 100, which is inputted into a VC terminal of the start-up circuit 130, and the start-up circuit 130 outputs the power supply voltage Vcc to an OUT terminal. The start-up circuit 130 is a circuit which is operated only when the forward voltage VFWD, supplied from the auxiliary winding P2, is equal to or less than a predetermined voltage value. The start-up circuit 130 supplies the power supply voltage Vcc only when the switching power supply 100 is started up.

The regulator 140 is a three-terminal regulator or a step-down type switching power supply. The regulator 140 generates a power supply voltage Vcc2, with which the CPU 11 is driven, from the power supply voltage Vcc inputted into a VC terminal, and the regulator 140 outputs the power supply voltage Vcc2 to a VC terminal of the CPU 11 from an OUT terminal.

The feedback unit 150 forming a feedback means feeds back, to the primary side, information corresponding to the voltage value of the output voltage Vout outputted to the secondary side of the transformer T1, so as to control the output voltage Vout to a predetermined voltage value. A voltage of the output voltage Vout is divided by voltage dividing resistors R52, R53, and is inputted into a reference terminal REF of a shunt regulator IC5. An increase in voltage of the output voltage Vout increases a cathode current of the shunt regulator IC5, thus increasing an electric current which flows from the output voltage Vout to a diode on the secondary side of a photocoupler PC1 through a pull-up resistor R51. With such an increase, an electric current which flows to a phototransistor on the primary side of a photocoupler PC5 increases so that charges are discharged from a capacitor C5. As a result, a voltage VFB to be inputted into an FB terminal of the CPU 11 decreases. On the other hand, a decrease in output voltage Vout reduces a cathode current of the shunt regulator IC5, thus reducing an electric current which flows from the output voltage Vout in a diode on the secondary side of the photocoupler PC1 through the pull-up resistor R51. With such reduction, an electric current which flows to a phototransistor on the primary side of the photocoupler PC5 is reduced. Accordingly, an electric current flows from the power supply voltage Vcc to the capacitor C5 through a resistor R50, thus charging the capacitor C5, whereby a voltage VFB to be inputted into the FB terminal of the CPU 11 increases. As described above, the feedback unit 150 changes a voltage VFB to be inputted into the FB terminal of the CPU 11 corresponding to a fluctuation in voltage value of the output voltage Vout.

[Internal Configuration of CPU]

Figure 1B:
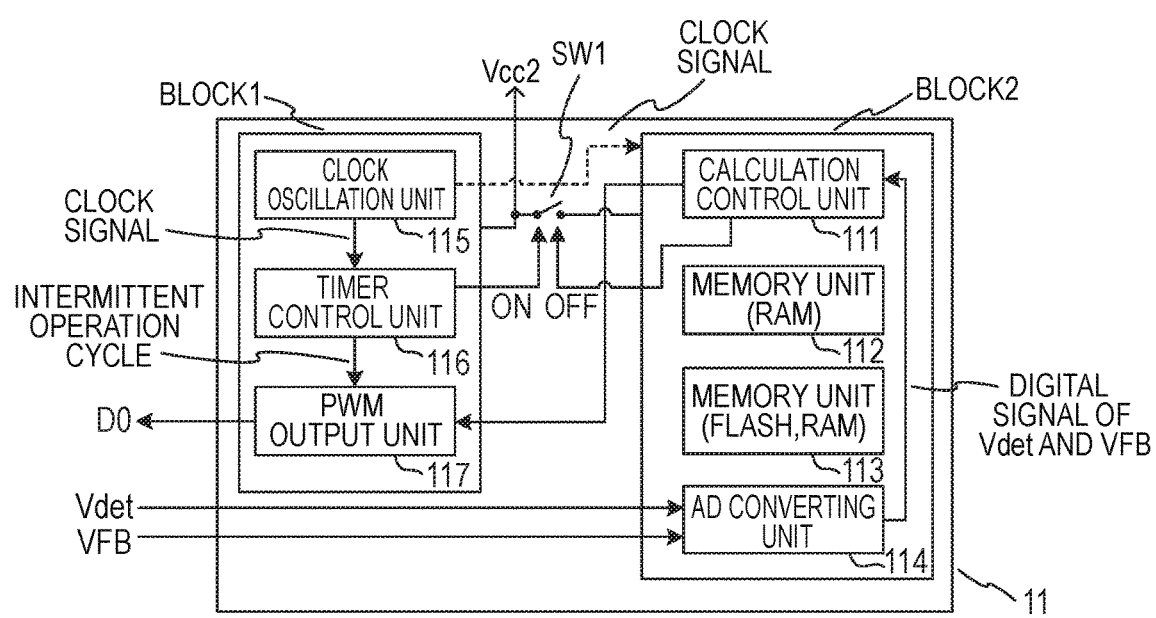
FIG. 1B is a block diagram showing an internal configuration of a CPU.

FIG. 1B is a function block diagram showing an internal configuration of the CPU 11. The CPU 11 is formed of a one-chip microcomputer. The inside of the CPU 11 is divided into a block 1 and a block 2. The block 1 includes a clock oscillation unit 115, a timer control unit 116 and a PWM output unit 117. On the other hand, the block 2 includes a calculation control unit 111, a memory unit 112, a memory unit 113 and an AD converting unit 114.

The calculation control unit 111 is a control unit which performs calculation control based on clock signals supplied from the clock oscillation unit 115. The calculation control unit 111 temporarily reads out a control program and data, stored in the memory unit 113 formed of a flash memory or a ROM, into the memory unit 112 formed of a RAM. Thereafter, the calculation control unit 111 sequentially performs calculation based on the control program and data set in the memory unit 112. The voltage Vdet is inputted into a terminal VAC of the AD converting unit 114 from the voltage detection unit 120, and the voltage VFB is inputted into an FB terminal of the AD converting unit 114 from the voltage detection unit 120. Digital values, which are obtained by performing A/D conversion on the voltage Vdet and the voltage VFB, are inputted into the calculation control unit 111. Based on the voltage Vdet and the voltage VFB, the calculation control unit 111 performs control of set values (control start timing, cycle, duty) of the PWM signal which the PWM output unit 117 outputs from a D0 terminal, thus performing switching control of the FET 1. The relationship between the voltage Vdet and the control signal D0 is described later.

In response to a clock signal supplied from the clock oscillation unit 115, the timer control unit 116 performs control of a timer which controls a length of a switching halt period of the FET 1 in an intermittent operation state in a low voltage control mode described later. In the switching halt period described later, the CPU 11 halts outputting of the control signal D0 from the PWM output unit 117, thus maintaining a switching halt state of the FET 1.

A power supply voltage Vcc2 is supplied to the CPU 11 from the regulator 140. The power supply voltage Vcc2 is always supplied to the block 1. The power supply voltage Vcc2 is supplied to the block 2 through a sleep control switch SW1. Accordingly, even when the switch SW1 is in an OFF state, the clock oscillation unit 115, the timer control unit 116, and the PWM output unit 117 of the block 1 can continue an operation. On the other hand, the calculation control unit 111, the memory unit 112, the memory unit 113, and the AD converting unit 114 of the block 2 can be operated only when the switch SW1 is in an ON state so that the power supply voltage Vcc2 is supplied to the block 2. Accordingly, when the switch SW1 is in an OFF state (a sleep state of the CPU 11 described later), the power supply voltage Vcc2 is not supplied to the block 2 and hence, the calculation control unit 111, the memory unit 112, the memory unit 113, and the AD converting unit 114 are brought into an operation halt state. With such a configuration, when the CPU 11 is in the sleep state, power consumption of the calculation control unit 111, the memory unit 112, the memory unit 113, and the AD converting unit 114, which are disposed in the block 2, can be reduced. Conditions under which the switch SW1 is set to an OFF state, and the CPU 11 is brought into a sleep state are described later. A method for reducing power consumption of the block 2 of the CPU 11 is not limited to the above-mentioned method, and the following method may be adopted, for example. That is, a method may be adopted where a clock signal to be supplied to the block 2 of the CPU 11 from the clock oscillation unit 115 is supplied to the block 2 through a switch substantially equal to the switch SW1, and the switch is set to an OFF state when the CPU 11 is in a sleep state, thus cutting off a supply of the clock signal to the block 2.

[Switching Control of FET 1]

Figure 2A:
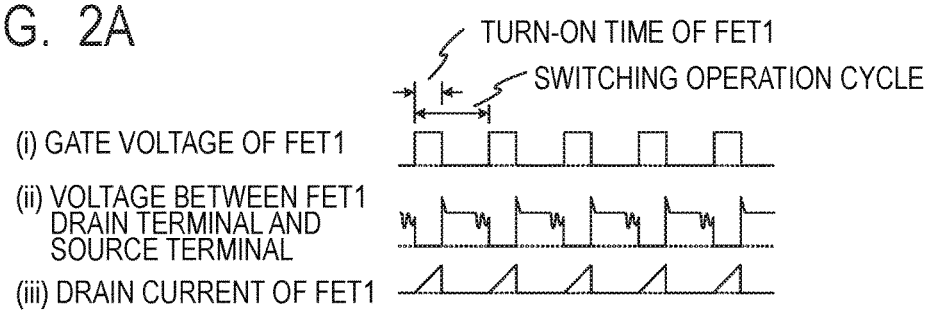
FIG. 2A, FIG. 2B and FIG. 2C are timing chart for describing control of the switching power supply of the embodiment 1.
Figure 2B:
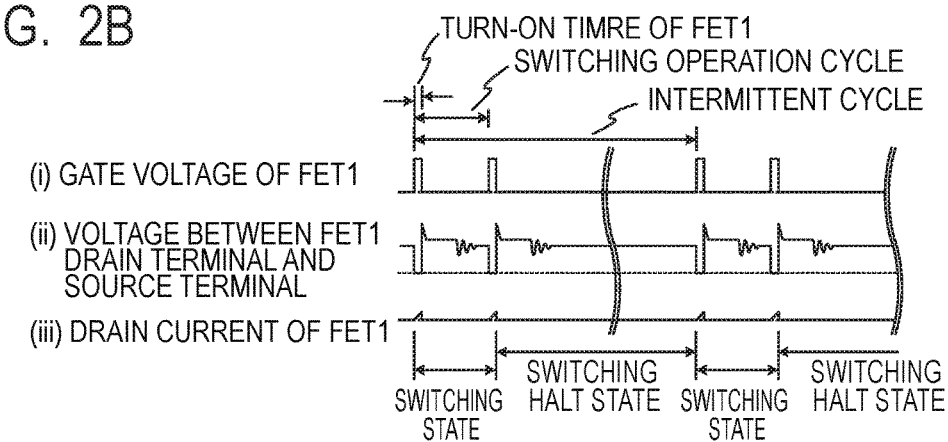
Figure 2C:
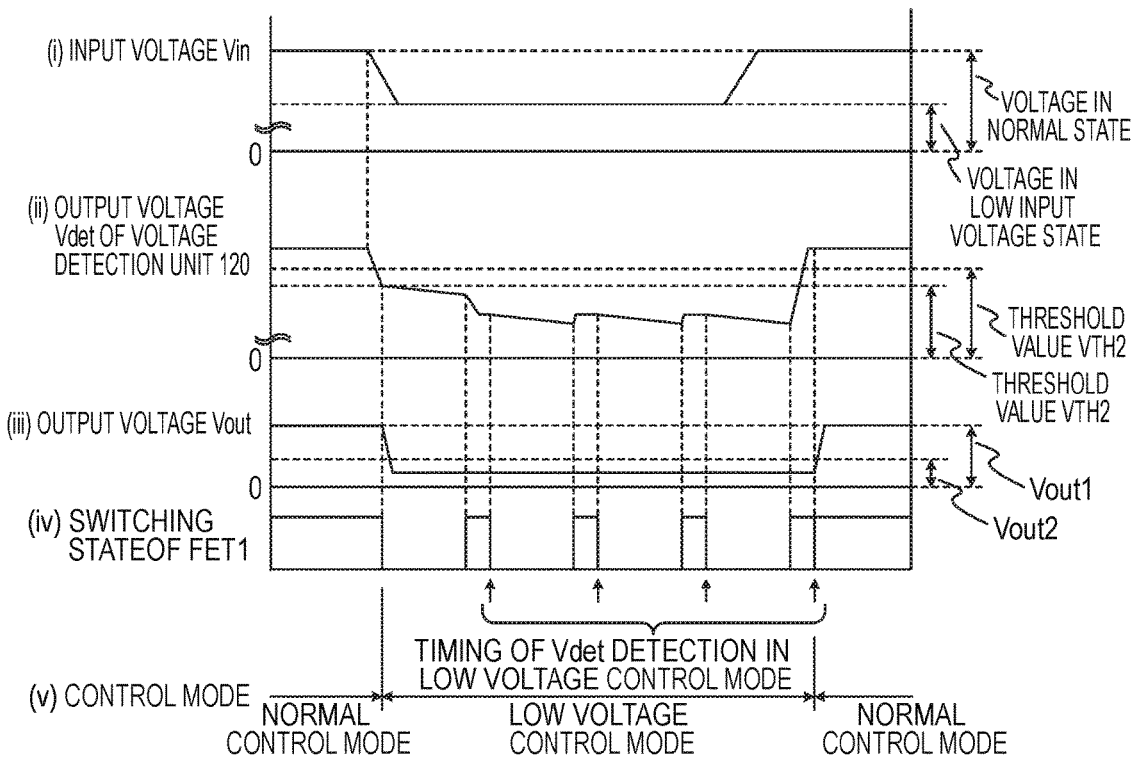

FIGS. 2A, 2B and 2C are timing charts for describing switching control of the FET 1 shown in FIG. 1A when the voltage value of the AC power supply 10 is in a normal state, and when the voltage value of the AC power supply 10 is in an abnormal state of low voltage. FIG. 2A is a chart for describing a normal control mode (first state) which is control performed when the voltage value of the AC power supply 10 is a normal voltage value falling within the rated range. In FIG. 2A, (i) shows a voltage waveform of an input voltage of the gate terminal of the FET 1 (gate voltage), and (ii) shows a voltage waveform of a voltage between a drain terminal and a source terminal of the FET 1. Further, (iii) shows a waveform of a drain current which flows into the drain terminal of the FET 1. Time is taken on an axis of abscissas in FIG. 2A. In the normal control mode, the CPU 11 of the power supply control unit 110 performs control of turn-on duty of the FET 1 based on a voltage VFB outputted from the feedback unit 150, thus maintaining the output voltage Vout at the voltage Vout1 which is a predetermined output voltage.

FIG. 2B is a chart for describing a low voltage control mode (second state) which is control performed when the voltage value of the AC power supply 10 is in a low voltage state where the voltage value is lower than the rated range. In FIG. 2B, (i), (ii) and (iii) show voltage waveforms and a current waveform, which are substantially equal to those in FIG. 2A, and hence, the repeated description is omitted in this paragraph. Time is taken on an axis of abscissas in FIG. 2B. Further, (i) to (iii) given in parentheses indicate (i) to (iii) in FIG. 2B. In this embodiment, when it is detected, based on the output voltage Vdet of the voltage detection unit 120, that the voltage value of the input voltage Vin is in a low voltage state falling outside the rated range, the CPU 11 shifts control of the switching power supply 100 from a normal control mode to a low voltage control mode. In the low voltage control mode, the CPU 11 monitors the voltage value of the AC power supply 10 based on the voltage Vdet outputted from the voltage detection unit 120 while controlling the output voltage Vout so as not to exceed a voltage Vout2 (second output voltage).

In the low voltage control mode, to detect a state of the input voltage Vin with the voltage detection unit 120, the CPU 11 performs a switching operation of the FET 1. In performing the switching operation, to prevent the voltage value of the output voltage Vout from exceeding the voltage Vout2, the CPU 11 performs an intermittent operation ((iii)). In the intermittent operation, the period of a switching state, where switching control of the FET 1 is performed, and the period of a switching halt state are repeated in an intermittent cycle ((i)). In this embodiment, the voltage Vout2 is 2 V. When the voltage value of the output voltage Vout is equal to or less than the voltage Vout2, the DC/DC converter 21 halts outputting of the output voltage Vout3 since the voltage Vout2 is a voltage lower than the above-mentioned voltage Vout3 (=3.3 V) (Vout2<Vout3). With such an operation, the power supply voltage Vout3 is not supplied to the CPU 22 of the control unit 20 and hence, the CPU 22 of the control unit 20 is brought into an operation halt state. The reason the output voltage Vout is set to the voltage Vout2 which is lower than the voltage Vout3 is to reliably halt outputting of the power supply voltage Vout3 from the DC/DC converter 21, thus preventing the CPU 22 from being operated in the low voltage state. In the low voltage control mode, provided that the voltage value of the output voltage Vout is equal to or more than 0 V, and does not exceed the voltage value of the voltage Vout2 (=2 V), the number of times of switching of the FET 1 and the time period of the switching halt state in the intermittent operation may be arbitrarily decided. For example, as shown in FIG. 2B (i), the number of times of switching of the FET 1 in the switching state in the intermittent cycle is set to two times. However, the number of times of switching may be arbitrarily decided, and it is sufficient to set the number of times of switching to at least one time. The intermittent cycle ((i)) is a time period obtained by adding the period where the FET 1 is in a switching state (first period) ((iii)) and the period where the FET 1 is in a switching halt state (second period) ((iii)). In the low voltage control mode, to prevent the output voltage Vout from exceeding the voltage Vout1 which is an output voltage in the normal control mode, the CPU 11 performs control of turn-on duty (turn-on time) of the FET 1 to a value smaller than that in the normal control mode (FIG. 2A (i))

((i)). The switching operation of the FET 1 in the low voltage control mode is performed to detect the input voltage Vin based on a voltage VFWD induced in the auxiliary winding P2 due to the switching operation of the FET 1.

FIG. 2C is a chart for describing the output voltage Vdet of the voltage detection unit 120, a switching state of the FET 1, the output voltage Vout, and transition of the control mode when the input voltage Vin changes from a normal voltage state falling within the rated range to a low voltage state and, then, returns again to a voltage state falling within the rated range. (i) is a voltage waveform showing the voltage of the input voltage Vin which is an inter-terminal voltage of the capacitor Cin, (ii) is a voltage waveform showing the voltage of the output voltage Vdet of the voltage detection unit 120, and (iii) is a voltage waveform showing the voltage of the output voltage Vout. Further, (iv) is a chart showing a switching state of the FET 1 (in the chart, a state where pulses rise indicates a state where the switching operation is being performed), and (v) shows a control mode of the CPU 11. Time is taken on an axis of abscissas. (i) to (v) given in parentheses indicate FIG. 2C (i) to FIG. 2C (v).

When the voltage value of the AC power supply 10 is a normal voltage value falling within the rated range, the input voltage Vin also is a voltage in a normal state ((i)). In this state, the output voltage Vdet of the voltage detection unit 120 is higher than a voltage VTH1 and a voltage VTH2 ((ii)). The voltage VTH1 is a threshold for detecting that the input voltage Vin is in a low voltage state falling outside the rated range. The voltage VTH2 is a threshold for determining that the input voltage Vin is in a normal voltage state falling within the rated range. During a period where the voltage Vdet is higher than the threshold VTH1, the FET 1 is subjected to switching control by the CPU 11 in a normal control mode described with reference to FIG. 2A ((iv)), and the voltage value of the output voltage Vout is the voltage Vout1 which is a predetermined voltage ((iii)).

Next, when the voltage value of the AC power supply 10 decreases to be a low voltage state, the input voltage Vin ((i)) and the output voltage Vdet ((ii)) also decrease. When the output voltage Vdet is less than the voltage VTH1 which is the threshold (less than the second threshold voltage), the CPU 11 of the power supply control unit 110 detects that the input voltage Vin is in a low voltage state, thus shifting a control mode to a low voltage control mode ((v)) described with reference to FIG. 2B to cause the FET 1 to perform the intermittent operation ((iv)). With such operations, the CPU 11 performs control to prevent the voltage value of the output voltage Vout from exceeding the voltage Vout2 ((iii)).

During a period where a low voltage state of the AC power supply 10 continues, the CPU 11 maintains a low voltage control mode ((v)), and continues to detect the voltage of the input voltage Vin based on the output voltage Vdet outputted from the voltage detection unit 120 ((ii), (iv)). When the CPU 11 detects that the output voltage Vdet outputted from the voltage detection unit 120 is equal to or more than the voltage VTH2 which is the threshold (equal to or more than the first threshold voltage) ((ii)), the CPU 11 determines that the input voltage Vin is a normal voltage value, thus returning a control mode from the low voltage control mode to the normal control mode ((v)). In this embodiment, the voltage VTH2 is the threshold for detecting that the input voltage Vin is restored to a normal state. The voltage VTH2 is set to a voltage larger than the voltage VTH1 which is the threshold for detecting a low voltage state of the input voltage Vin ((ii)). Such a setting allows the switching of a control mode to have hysteresis property.

In the low voltage control mode, during a period where the FET 1 is in a switching halt state, a voltage is not induced in the auxiliary winding P2 of the transformer T1 and hence, the voltage of the forward voltage VFWD is 0 V. As a result, the charge charged into the capacitor C121 is discharged, and the voltage value of the output voltage Vdet, which the voltage detection unit 120 outputs to the CPU 11, continues to decrease ((ii)). Accordingly, when the CPU 11 of the power supply control unit 110 reads out the voltage Vdet in a state where the FET 1 is not performing the switching operation, a voltage value which is lower than a voltage value calculated by the above-mentioned (formula 1) is detected as the voltage value of the input voltage Vin. On the other hand, during a period where the FET 1 is in a switching operation state, the forward voltage VFWD expressed by (formula 1) is supplied to the voltage detection unit 120. Therefore, when the FET 1 is in the switching operation state, the voltage Vdet to be outputted to the CPU 11 from the voltage detection unit 120 becomes a voltage value which corresponds to the input voltage Vin. In view of the above, in the low voltage control mode, the CPU 11 detects the voltage Vdet outputted from the voltage detection unit 120 after performing switching of the FET 1 for a predetermined period ((iv)), thus increasing accuracy in detecting the voltage of the input voltage Vin. In this embodiment, when the FET 1 performs a switching operation, as shown in FIG. 2B (i), the FET 1 performs switching a plurality of times (two times). In FIG. 2C (iv), timings at which a voltage Vdet is detected in the low voltage control mode are indicated by arrows.

During a switching halt period of the FET 1, a switching operation of the FET 1 is not performed and hence, a voltage is not induced in the auxiliary winding P2 whereby the forward voltage VFWD becomes 0 V. Therefore, power is consumed by the operation of the regulator 140 and the CPU 11 so that the charge charged into the capacitor C10 continues to decrease whereby the power supply voltage Vcc decreases. Accordingly, when power consumption of the CPU 11 is not reduced during a switching halt period, the regulator 140 becomes unable to supply a power supply voltage Vcc2 to the CPU 11, thus resulting in halting of the operation of the CPU 11. In view of the above, in this embodiment, the CPU 11 performs control of the switch SW1 such that supply of a power supply voltage to the block 2 is halted during a switching halt period in the low voltage control mode, thus reducing power consumption of the CPU 11. At the time of start of a switching halt period of the intermittent operation, the switch SW1 is set to an OFF state by the calculation control unit 111 (see FIG. 1B). At the timing when the switching operation halt period of the FET 1 is finished, the CPU 11 sets the switch SW1 to an ON state by the timer control unit 116 (see FIG. 1B). The calculation control unit 111 performs control of a PWM output unit 117 to perform the switching operation of the FET 1, and the CPU 11 finishes the detection of the output voltage Vdet outputted from the voltage detection unit 120. When the CPU 11 detects a low voltage state, the CPU 11 sets the switch SW1 to an OFF state again in shifting a state to the switching halt state. During the period of the low voltage control mode, the CPU 11 repeats the above-mentioned control of the switch SW1 and switching control of the FET 1.

[Control Sequence for Voltage Control Mode]

Figure 3:
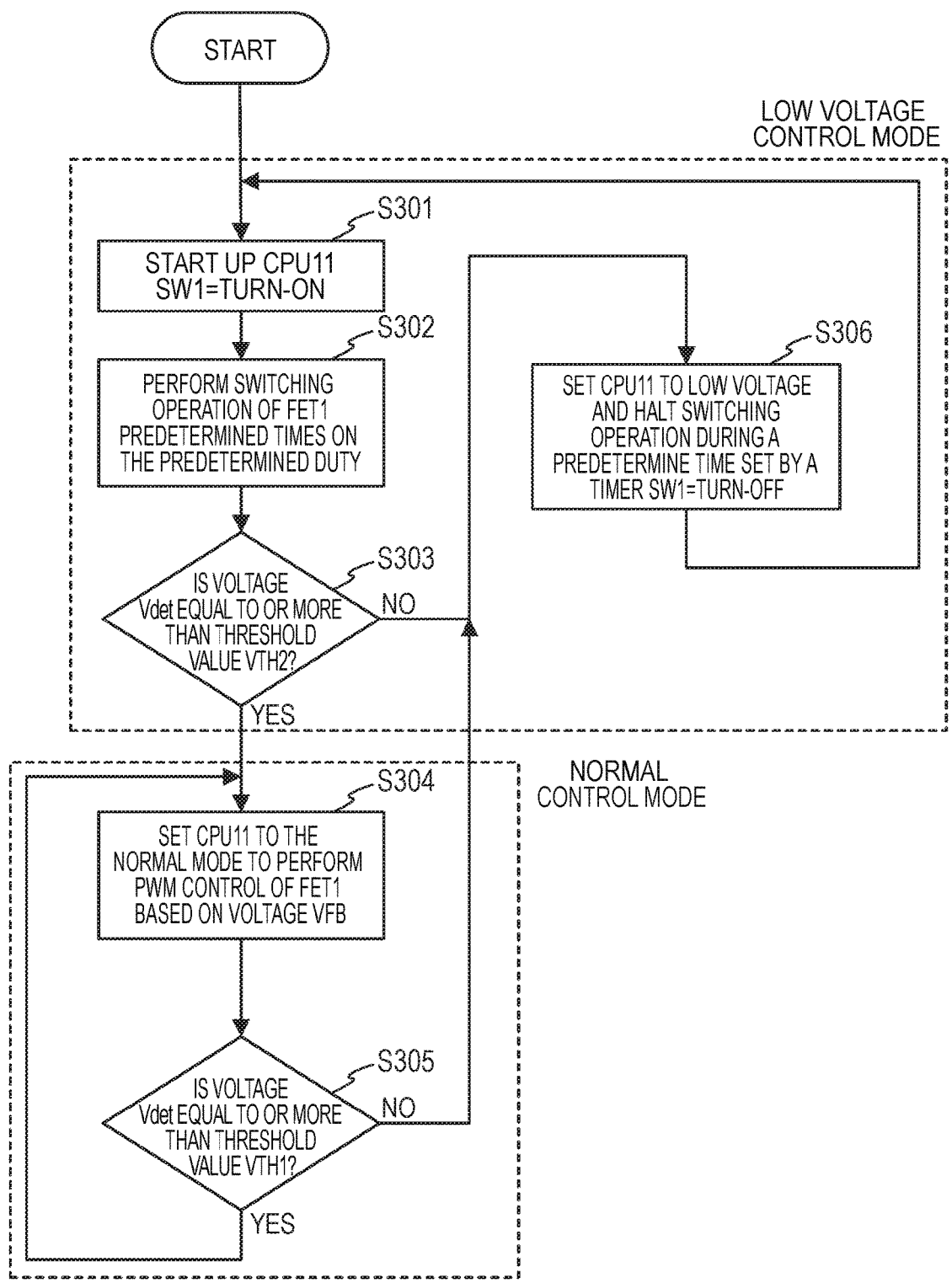
FIG. 3 is a flowchart showing control sequence for the switching power supply of the embodiment 1.

FIG. 3 is a flowchart showing control sequence for control mode when the CPU 11 of the power supply control unit 110 in this embodiment performs control of the switching power supply 100. Processing shown in FIG. 3 is started up with the application of the AC power supply 10 to the switching power supply 100, and the processing is executed by the CPU 11 of the power supply control unit 110 which performs control of the switching power supply 100.

In step (hereinafter, referred to as "S") 301, the CPU 11 starts up, and performs start-up processing, such as initial setting of parameters, thus bringing about a state where the CPU 11 can control the switching power supply 100. In S302, the CPU 11 performs control of the PWM output unit 117 with the calculation control unit 111, thus performing a switching operation of the FET 1 predetermined times (two times, for example) on the predetermined duty. Then, the CPU 11 acquires the output voltage Vdet outputted from the voltage detection unit 120 by the calculation control unit 111 and via the AD converting unit 114.

In S303, the CPU 11 determines whether or not the voltage value of the output voltage Vdet, which is outputted from the voltage detection unit 120 and is acquired in S302, is equal to or more than the voltage VTH2, which is the threshold for the normal control mode. When the calculation control unit 111 determines that the voltage value of the voltage Vdet is equal to or more than the voltage VTH2, the CPU 11 advances the processing to S304. On the other hand, when the calculation control unit 111 determines that the voltage value of the voltage Vdet is less than the voltage VTH2, the CPU 11 advances the processing to S306.

In S304, the CPU 11 acquires, by the calculation control unit 111 and via the AD converting unit 114, a voltage VFB which is inputted into an FB terminal and is to be outputted from the feedback unit 150. Then, the CPU 11 performs control of the PWM output unit 117 with the calculation control unit 111 to perform the switching operation of the FET 1 (PWM control). That is, the calculation control unit 111 performs control of the PWM output unit 117 to control turn-on duty of the FET 1 based on the voltage VFB such that the voltage value of the output voltage Vout is to be the voltage Vout1 which is a predetermined voltage. The CPU 11 performs the switching operation of the FET 1 (PWM control) in this manner.

In S305, the CPU 11 acquires, by the calculation control unit 111 and via the AD converting unit 114, the output voltage Vdet outputted from the voltage detection unit 120, and the CPU 11 determines whether or not the voltage value of the voltage Vdet is equal to or more than the voltage VTH1 which is the threshold for the normal control mode. When the calculation control unit 111 determines that the voltage value of the voltage Vdet is equal to or more than the voltage VTH1, the CPU 11 returns the processing to S304. On the other hand, when the calculation control unit 111 determines that the voltage value of the voltage Vdet is less than the voltage VTH1, the CPU 11 determines that the input voltage Vin is in a low voltage state, thus advancing the processing to S306.

In S306, after the calculation control unit 111 sets the switch SW1 to an OFF state, the CPU 11 halts the processing during a predetermined time set in the timer control unit 116. Thereafter, with a lapse of the predetermined time set in the timer control unit 116, the processing in S301 is started up.

The above-mentioned processing in S301, S302, S303, and S306 is the processing in the low voltage control mode. By repeating the processing in S301, S302, S303, and S306, as described with reference to FIG. 2C (iii), the voltage value of the output voltage Vout can be controlled to a voltage which is equal to or more than 0 V, and is equal to or less than the voltage Vout2, that is, to a voltage at which the CPU 22 is prevented from starting up. Further, the above-mentioned processing in S304 and S305 is control sequence for the normal control mode. By performing the above described control sequence, the CPU 11 of the switching power supply 100 detects the voltage value of the input voltage Vin by making use of the auxiliary winding P2 of the transformer T1. When a low voltage falling outside the rated range is inputted, the CPU 11 performs control of the voltage value of the output voltage Vout to a voltage which is equal to or less than the voltage Vout2, thus halting the operation of the CPU 22, forming a load on the switching power supply 100.

In the switching power supply 100 of this embodiment, the voltage value of the input voltage Vin is detected by making use of the forward voltage VFWD induced in the auxiliary winding P2. As a method for detecting a voltage value of the input voltage Vin, for example, a method may be adopted where the input voltage Vin is resistively divided, thus allowing the CPU 11 to detect the input voltage Vin. However, a voltage value of the input voltage Vin is large compared to that of the forward voltage VFWD to be inputted into the voltage detection unit 120. Accordingly, when the method is adopted where the input voltage Vin is directly detected by resistive voltage division, the power rating required for the voltage dividing resistor is increased and, as a result, dimensions of the voltage detection circuit and power consumption increase. Further, when the resistance value of the voltage detection circuit, which detects the input voltage Vin by resistive voltage division, is increased so as to reduce power consumption of the voltage detection circuit, time constant is increased, and responsiveness of the voltage detection circuit is lowered. As a result, the case where the input voltage Vin is directly detected by resistive voltage division requires a long time to decrease the voltage value of the output voltage Vout of the switching power supply 100 to equal to or less than the voltage Vout2 after an AC voltage from the AC power supply 10 is in a low voltage state.

On the other hand, in the switching power supply 100 of this embodiment, the voltage of the input voltage Vin is detected based on the forward voltage VFWD induced in the auxiliary winding P2 of the transformer T1. As shown in the above-mentioned (formula 1), the forward voltage VFWD can be made smaller than the input voltage Vin by making the number of windings N2 of the auxiliary winding P2 of the transformer T1 smaller than the number of windings N1 of the primary winding P1 of the transformer T1. Accordingly, the power rating required for the voltage dividing resistors R121, R122 of the voltage detection unit 120 can be also made small, causing the dimensions of the voltage detection circuit to be reduced. As a result, in this embodiment, both reduction in power consumption of the voltage detection unit 120 and favorable responsiveness in detecting a voltage can be realized.

As has been described above, according to this embodiment, in the low input voltage state, the output voltage of the switching power supply can be controlled to a low level. Further, power consumption of the low voltage detection circuit can be reduced, and responsiveness in detecting a voltage can be improved.

In the embodiment 1, the description has been made with respect to an embodiment which uses a switching power supply provided with a flyback transformer. In an embodiment 2, the description is made with respect to an embodiment which uses a switching power supply where an active clamp circuit is mounted on a flyback transformer.

[Configuration of Switching Power Supply]

Figure 4A:
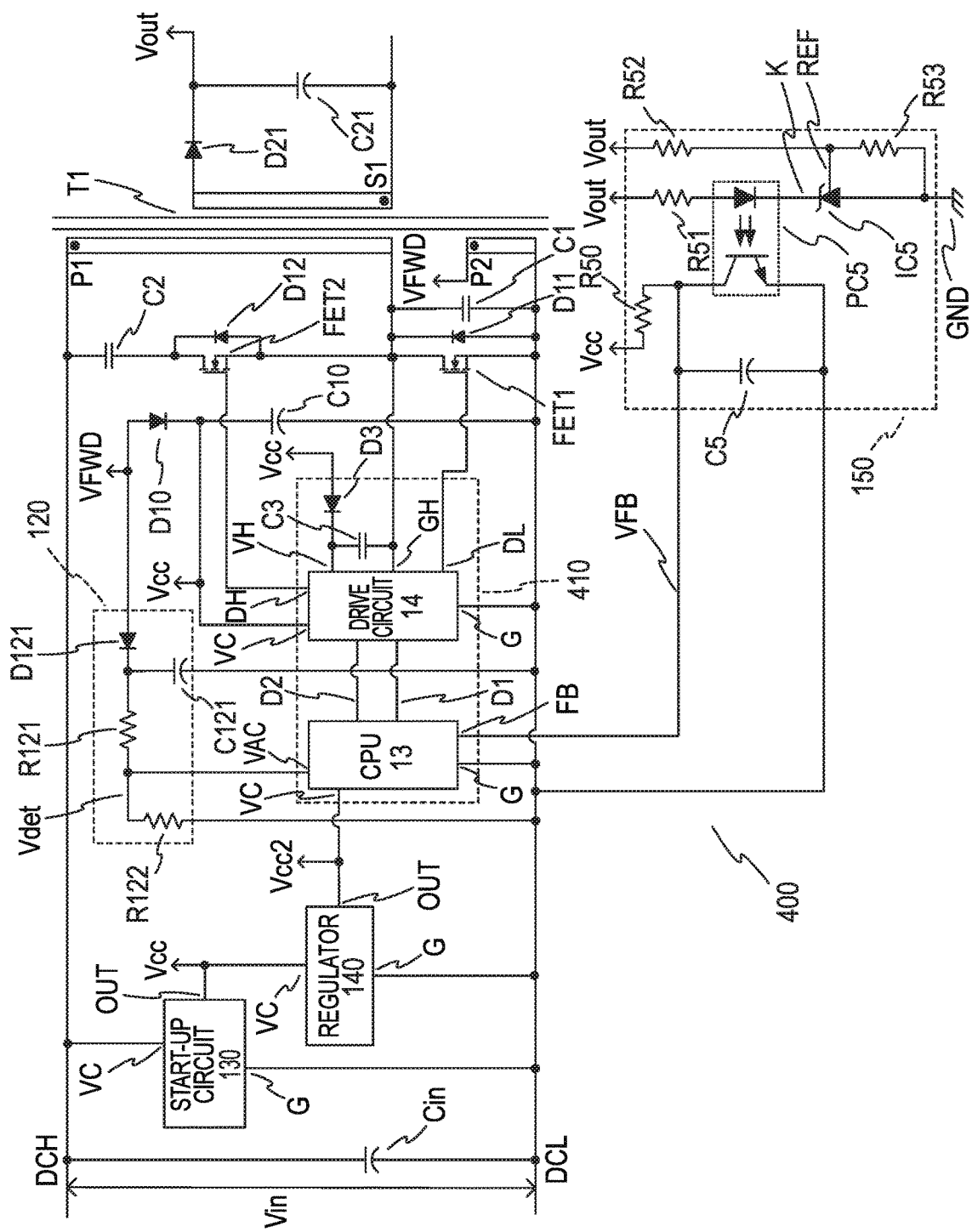
FIG. 4A is a circuit diagram showing a configuration of a switching power supply of an embodiment 2.

FIG. 4A is a circuit diagram showing a configuration of a switching power supply 400 of the embodiment 2. The switching power supply 400 of this embodiment differs from the switching power supply 100 described in the embodiment 1 with respect to a point that an active clamp circuit which uses an FET 2 (second switching element) and a voltage resonance capacitor C2 is added. Further, in this embodiment, a power supply control unit 410 is used instead of the power supply control unit 110 and hence, a method for controlling the FETs (FET 1 and FET 2) differs from that in the switching power supply 100. Hereinafter, the description is made with respect to the active clamp circuit and the power supply control unit 410 which makes the switching power supply 400 of this embodiment different from the switching power supply 100 of the embodiment 1. The circuit configurations of this embodiment substantially equal to those in the embodiment 1 are given the same characters, and the repeated description is omitted in this embodiment. In FIG. 4A, an AC power supply 10 and a bridge diode BD1 of the switching power supply 400 are omitted. Further, an output voltage Vout of the switching power supply 400 is assumed to be supplied to a control unit 20 of an apparatus (not shown in the drawing) on which the switching power supply 400, forming a load, is mounted. The configuration of the control unit 20 is substantially equal to the corresponding configuration in the embodiment 1, and the repeated description is omitted in this embodiment.

The FET 1 and the active clamp circuit are provided to a primary winding P1 of a transformer T1. The FET 1 is connected in series to the primary winding P1. The active clamp circuit is connected in parallel to the primary winding P1, and the capacitor C2 and the FET 2 are connected in series to each other in the active clamp circuit. The switching power supply 400 can suppress, by the active clamp circuit, a surge voltage, which is generated between a drain terminal and a source terminal of the FET 1 when the FET 1 is turned off. Accordingly, in general, the switching power supply 400 can output a larger power compared to the switching power supply 100. A voltage resonance capacitor C1, which is connected in parallel to the FET 1, is provided for reducing a loss when the FET 1 and the FET 2 are in an OFF state. Further, a diode D11 is a body diode of the FET 1, and a diode D12 is a body diode of the FET 2.

The power supply control unit 410 is a circuit for controlling the FET 1 and the FET 2, and is formed of a CPU 13 and a drive circuit 14. In the same manner as the CPU 11 in the embodiment 1, the CPU 13 is a one-chip microcomputer including a calculation unit which is operated in response to a clock signal. The CPU 13 detects a voltage Vdet outputted from the voltage detection unit 120, and a voltage VFB outputted from the feedback unit 150, and the CPU 13 outputs control signals D1, D2, which are PWM signals, to the drive circuit 14 based on a detection result. The CPU 13 differs from the CPU 11 in the embodiment 1 with respect to a point that the CPU 13 performs control of the FET 2 in addition to the FET 1. In the same manner as the drive circuit 12 in the embodiment 1, the drive circuit 14 is a circuit which generates, in response to the control signals D1, D2 outputted from the CPU 13, drive signals DL, DH to be outputted to gate terminals of the FET 1 and the FET 2. A power supply voltage is supplied to a VH terminal of the drive circuit 14 by a charge pump circuit, which is formed of a capacitor C3 and a diode D3, so as to drive the FET 2 in addition to the FET 1.

[Internal Configuration of CPU]

Figure 4B:
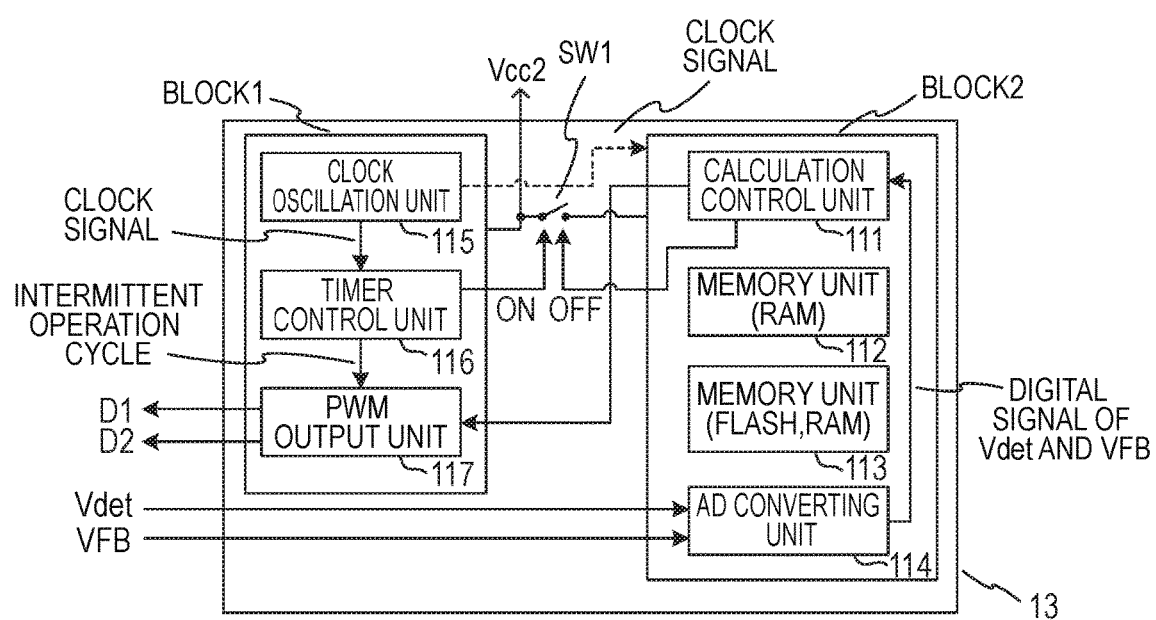
FIG. 4B is a block diagram showing an internal configuration of a CPU.

FIG. 4B is a function block diagram showing an internal configuration of the CPU 13. The CPU 13 is formed of a one-chip microcomputer. The inside of the CPU 13 is divided into a block 1 and a block 2 in the same manner as the CPU 11 in the embodiment 1. The block 1 includes a clock oscillation unit 115, a timer control unit 116, and a PWM output unit 118. On the other hand, the block 2 includes a calculation control unit 111, a memory unit 112, a memory unit 113, and an AD converting unit 114. The CPU 13 uses the PWM output unit 118 in place of the PWM output unit 117 of the CPU 11 in the embodiment 1. The PWM output unit 118 outputs the control signal D2 for the FET 2 in addition to the control signal D1 for the FET 1. Other configurations of the CPU 13 are substantially equal to the corresponding configuration of the CPU 11 in the embodiment 1. The identical configurations are given the same characters, and the repeated description is omitted in this embodiment.

[Switching Control of FET 1]

FIGS. 5A to 5C are timing charts for describing switching control of the FET 1 and the FET 2 shown in FIG. 4A when the voltage value of the AC power supply 10 is in a normal state, and when the voltage value of the AC power supply 10 is in an abnormal state of low voltage. FIG. 5A is a chart for describing a normal control mode which is control performed when the voltage value of the AC power supply 10 is a normal voltage value falling within the rated range. In FIG. 5A, (i) shows a voltage waveform of an input voltage of a gate terminal of the FET 1 (gate voltage), (ii) shows a voltage waveform of an input voltage of a gate terminal of the FET 2 (gate voltage), and (iii) shows a voltage waveform of a voltage between a drain terminal and a source terminal of the FET 1. Further, in FIG. 5A, (iv) shows a waveform of a drain current which flows into the drain terminal of the FET 1. Time is taken on an axis of abscissas in FIG. 5A.

Next, the switching operation of the switching power supply 400 in a normal control mode is described. In the switching power supply 400, a dead time TD during which the FET 1 and the FET 2 is in an OFF state is provided, and the power supply control unit 410 performs control of the FET 1 and the FET 2 such that the FET 1 and the FET 2 are alternately turned on and turned off. The output voltage Vout of the switching power supply 400 is controlled by turn-on duty of the FET 1. In the switching power supply 400, the output voltage Vout can be expressed by the following (formula 2).

output voltage $Vout = Vin \times (N2/N1) \times (TON1/T)$ (formula 2)

In this formula, Vin indicates an input voltage, N1 indicates the number of windings of the primary winding P1 of the transformer T1, N2 indicates the number of windings of the secondary winding S1 of the transformer T1, TON1 indicates the turn-on time of the FET 1, and T indicates a switching operation cycle of the FET 1 (the switching operation cycle of the FET 2).

In the normal control mode in FIG. 5A, the CPU 13 of the power supply control unit 410 performs switching of the FET 2 with a constant turn-on time TON2, so as to change the turn-on time TON1 of the FET 1 based on the voltage VFB to be inputted into the FB terminal, thus controlling the turn-on duty of the FET 1. Accordingly, based on the voltage VFB of the feedback unit 150, the CPU 13 performs control so that the output voltage Vout is to be the voltage Vout1 as a predetermined voltage value.

FIG. 5B is a chart for describing a low voltage control mode which is control performed when the voltage value of the AC power supply 10 is in a low voltage state where the voltage value is lower than the rated range. In FIG. 2B, (i), (ii), (iii) and (iv) show voltage waveforms and a current waveform substantially equal to those in FIG. 5A and hence, the repeated description is omitted in this paragraph. Time is taken on an axis of abscissas in FIG. 5B. Further, (i) to (iv) given in parentheses indicate (i) to (iv) in FIG. 5B.

In this embodiment, when it is detected, based on the output voltage Vdet of the voltage detection unit 120, that the voltage value of the input voltage Vin is in a low voltage state falling outside the rated range, the CPU 13 shifts control of the switching power supply 400 from a normal control mode to a low voltage control mode. In the low voltage control mode, the CPU 13 changes a turn-on time TON1 of the FET 1 based on the voltage Vdet to perform control of turn-on duty of the FET 1, thus controlling the output voltage Vout so as not to exceed a voltage Vout2.

Performing control of turn-on duty of the FET 1 based on the output voltage VFB of the feedback unit 150 allows the CPU 13 to control the output voltage Vout to a set predetermined voltage. Further, the CPU 13 can calculate turn-on duty of the FET 1 which corresponds to an output voltage as shown in (formula 2) by detecting the input voltage Vin based on the voltage Vdet, so that switching of the FET 1 can be performed with a proper turn-on time TON1 which corresponds to the input voltage Vin. In the low voltage control mode, the power supply control unit 410 causes the FET 1 and the FET 2 to perform an intermittent operation ((iv)). In this embodiment, a voltage Vout2 is set to 2 V, for example. When the voltage value of the output voltage Vout is equal to or less than the voltage Vout2, a DC/DC converter 21 halts outputting of the output voltage Vout3 since the voltage Vout2 is a voltage lower than the above-mentioned voltage Vout3 (=3.3 V) (Vout2<Vout3). With such an operation, the power supply voltage Vout3 is not supplied to the CPU 22 and hence, the CPU 22 is brought into an operation halt state. In the low voltage control mode, the number of times of switching of the FET 1 and the FET 2 and the time period of the switching halt state in the intermittent operation may be arbitrarily decided. For example, as shown in FIG. 5B (i) and (ii), the number of times of switching of the FET 1 and the FET 2 in the switching state in the intermittent cycle is set to three times. The intermittent cycle ((iv)) is a time period obtained by adding the period where the FET 1 and the FET 2 are in a switching state and the period where the FET 1 and the FET 2 are in a switching halt state. The switching operation of the FET 1 in the low voltage control mode is performed to detect the input voltage Vin based on the voltage Vdet outputted from the voltage detection unit 120 by performing the switching operation of the FET 1.

As has been described above, in the low voltage control mode, the CPU 13 of the power supply control unit 410 changes the turn-on time TON1 of the FET 1 based on the voltage Vdet to perform control of the turn-on duty of the FET 1, thus controlling the output voltage Vout so as not to exceed the voltage Vout2. FIG. 5C is a chart for describing the output voltage Vdet of the voltage detection unit 120, a switching state of the FET 1 and the FET 2, the output voltage Vout, and transition of the control mode when the input voltage Vin changes from a voltage state falling within the rated range to a low voltage state and, then, returns again to the voltage state falling within the rated range. (i) is a voltage waveform showing the voltage of the input voltage Vin which is an inter-terminal voltage of the capacitor Cin, (ii) is a voltage waveform showing the voltage of the output voltage Vdet of the voltage detection unit 120, and (iii) is a voltage waveform showing the voltage of the output voltage Vout. Further, (iv) is a chart showing the switching state of the FET 1 and the FET 2 (in the chart, a state where pulses rise indicates a state where a switching operation is being performed), and (v) shows a control mode of the CPU 13. Time is taken on an axis of abscissas. In the low voltage control mode, the CPU 13 detects a voltage Vdet outputted from the voltage detection unit 120 after performing switching of the FET 1 and the FET 2 for a predetermined period (iv), thus increasing accuracy in detecting the voltage of the input voltage Vin. A transition of the control mode in this embodiment is substantially equal to the transition of the control mode of the switching power supply 100 of the embodiment 1 described with reference to FIG. 2C and hence, the detailed description is omitted.

[Control Sequence for Voltage Control Mode]

Figure 6:
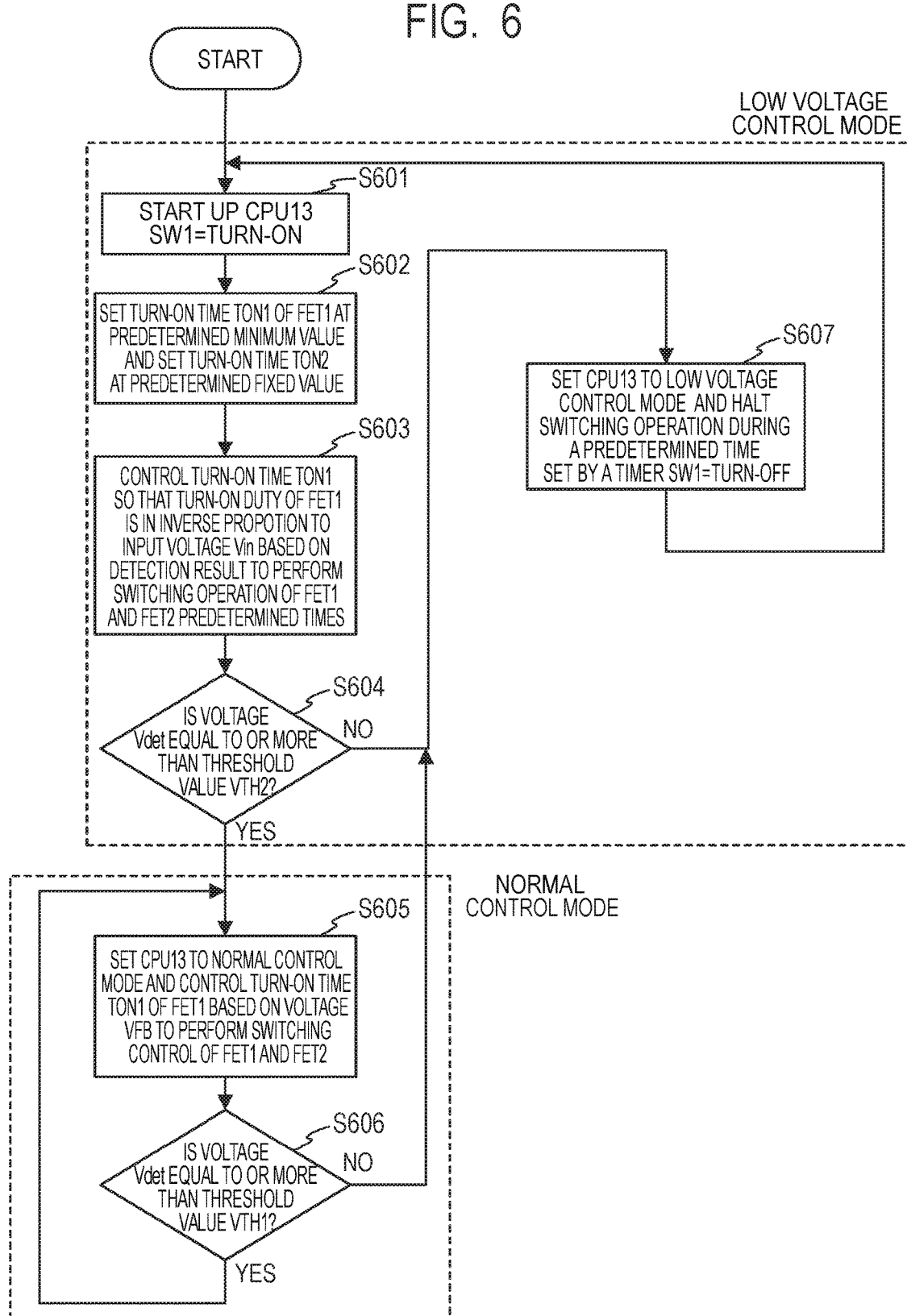
FIG. 6 is a flowchart showing control sequence for the switching power supply of the embodiment 2.

FIG. 6 is a flowchart showing control sequence for the control mode when the CPU 13 of the power supply control unit 410 in this embodiment performs control of the switching power supply 400. Processing shown in FIG. 6 is started up when the switching power supply 400 is turned on, and the processing is executed by the CPU 13 of the power supply control unit 410 which performs control of the switching power supply 400.

In S601, the CPU 13 starts up, and performs start-up processing, such as initial setting of parameters thus bringing about a state where the switching power supply 400 can be controlled. In S602, the CPU 13 sets, by the calculation control unit 111, the turn-on time TON1 of the FET 1 to a predetermined minimum value, and sets a turn-on time TON2 of the FET 2 to a predetermined fixed value. By setting the turn-on time TON1 of the FET 1 to the minimum value, even when a voltage value of the input voltage Vin is high, the CPU 13 can prevent the voltage value of the output voltage Vout from assuming a voltage value larger than the voltage Vout2.

In S603, the CPU 13 performs control of the PWM output unit 118 with the calculation control unit 111, thus starting switching control of the FET 1 and the FET 2 based on the minimum turn-on time TON1 of the FET 1 and the predetermined turn-on time TON2 of the FET 2 which are set in S602. The CPU 13 acquires the output voltage Vdet outputted from the voltage detection unit 120 by the calculation control unit 111 and via the AD converting unit 114. The CPU 13 continues to perform switching control of the FET 1 and the FET 2 predetermined times while controlling the turn-on time TON1 of the FET 1 so that turn-on duty of the FET 1 is in inverse proportion to a value of the input voltage Vin calculated based on the acquired voltage Vdet.

In S604, the CPU 13 determines, by the calculation control unit 111 and via the AD converting unit 114, whether or not the voltage value of the voltage Vdet, which is acquired from the voltage detection unit 120 at the time of performing the last switching operation of the FET 1 out of switching operations performed a predetermined times, is equal to or more than the voltage VTH2. When the calculation control unit 111 determines that the voltage value of the voltage Vdet is equal to or more than the voltage VTH2, the CPU 13 advances the processing to S605. On the other hand, when the calculation control unit 111 determines that the voltage value of the voltage Vdet is less than the voltage VTH2, the CPU 13 advances the processing to S607.

In S605, the CPU 13 acquires, by the calculation control unit 111 and via the AD converting unit 114, a voltage VFB which is inputted into an FB terminal and is outputted from the feedback unit 150. Then, the CPU 13 performs control of the PWM output unit 118 with the calculation control unit 111 to perform switching control of the FET 1 and the FET 2. That is, the calculation control unit 111 performs control of the PWM output unit 118 to control the turn-on time TON1 of the FET 1 based on the voltage VFB such that the voltage value of the output voltage Vout is to be the voltage Vout1 which is a predetermined voltage. The CPU 13 performs switching control of the FET 1 and the FET 2 in this manner.

In S606, the CPU 13 acquires, by the calculation control unit 111 and via the AD converting unit 114, the output voltage Vdet outputted from the voltage detection unit 120, and the CPU 13 determines whether or not the voltage value of the voltage Vdet is equal to or more than the voltage VTH1 which is the threshold for the normal control mode. When the calculation control unit 111 determines that the voltage value of the voltage Vdet is equal to or more than the voltage VTH1, the CPU 13 returns the processing to S605. On the other hand, when the calculation control unit 111 determines that the voltage value of the voltage Vdet is less than the voltage VTH1, the CPU 13 determines that the input voltage Vin is in a low voltage state, thus advancing the processing to S607.

In S607, after the calculation control unit 111 sets the switch SW1 to an OFF state, the CPU 13 halts the processing during a predetermined time set in the timer control unit 116. Thereafter, with a lapse of the predetermined time set by the timer control unit 116, the processing in S601 is started up.

The above-mentioned processing in S601, S602, S603, S604, and S607 is the processing in the low voltage control mode. By repeating the processing in S601, S602, S603, S604, and S607, as shown in FIG. 5C (iii), the voltage value of the output voltage Vout can be controlled to a voltage which is equal to or more than 0 V, and is equal to or less than the voltage Vout2, that is, to a voltage at which the CPU 22 is prevented from starting up. Further, the above-mentioned processing in S605 and S606 is control sequence for a normal control mode.

In the switching power supply 400 of this embodiment, when the turn-on time TON1 of the FET 1 is extremely short, there is insufficient energy supplied to the transformer T1. Accordingly, when the turn-on time TON1 of the FET 1 is extremely short, the forward voltage VFWD outputted from the auxiliary winding P2 becomes a voltage value smaller than a voltage value expressed by the above-mentioned (formula 1), thus lowering accuracy in detecting the input voltage Vin. On the other hand, when the turn-on time TON1 of the FET 1 is extremely long, the voltage value of the output voltage Vout in the low voltage control mode becomes a voltage value equal to or more than the voltage Vout2. As a result, the power supply voltage Vout3 is supplied to the CPU 22 from the DC/DC converter 21 of the control unit 20 on the load side so that the CPU 22 is operated. Accordingly, in the low voltage control mode, controlling the turn-on time TON1 of the FET 1 to a proper value corresponding to the input voltage Vin allows the detection of the voltage of the input voltage Vin with high accuracy without causing the CPU 22 to be operated.

In the switching power supply 400 of this embodiment, the output voltage Vout is decided by the input voltage Vin and the turn-on duty of the FET 1. Accordingly, also in the low voltage control mode in the same manner, the switching power supply 400 can be controlled by predicting the voltage value of the output voltage Vout which does not exceed the voltage Vout2. As a result, the turn-on time TON1 of the FET 1 is controlled based on the voltage Vdet so that the turn-on duty of the FET 1 is in inverse proportion to the input voltage Vin. Therefore, when the switching power supply 400 is restored from the low voltage control mode to the normal control mode, accuracy in detecting the voltage of the input voltage Vin can be increased.

As has been described above, according to this embodiment, in the low input voltage state, the output voltage of the switching power supply can be controlled to a low level. Further, power consumption of the low voltage detection circuit can be reduced, and responsiveness in detecting a voltage can be improved.

The switching power supply circuit which is the power supply apparatus described in the embodiment 1, 2 is applicable as, for example, a low-voltage power supply of an image forming apparatus, that is, as a power supply which supplies power to drive units such as a controller (control unit) and a motor. Hereinafter, the description is made with respect to the configuration of an image forming apparatus to which the power supply apparatus of the embodiment 1, 2 is applied.

[Configuration of Image Forming Apparatus]

Figure 7:
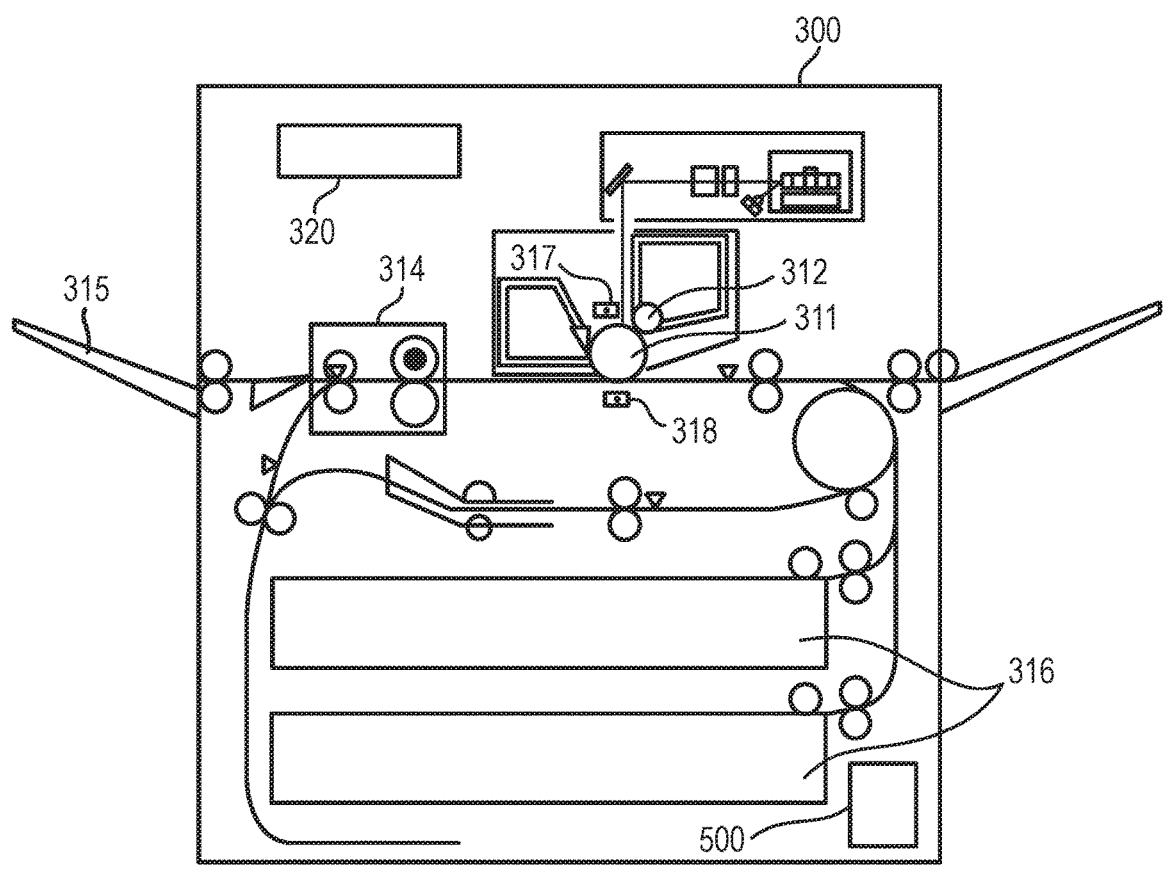
FIG. 7 is a view showing an image forming apparatus of an embodiment 3.

The description is made by taking a laser beam printer as one example of the image forming apparatus. FIG. 7 shows a schematic configuration of the laser beam printer which is one example of an electrophotographic printer. The laser beam printer 300 includes a photosensitive drum 311, a charging unit 317 (charging means), and a developing unit 312 (developing means). The photosensitive drum 311 functions as an image bearing member where an electrostatic latent image is formed. The charging unit 317 causes the photosensitive drum 311 to be uniformly charged. The developing unit 312 develops the electrostatic latent image formed on the photosensitive drum 311 with toner. The toner image developed on the photosensitive drum 311 is transferred, by transfer unit 318 (transfer means), to a sheet (not shown in the drawing) as a recording material supplied from a cassette 316 and, then, the toner image transferred to the sheet is fixed by a fixing device 314, and the sheet is discharged to a tray 315. The photosensitive drum 311, the charging unit 317, the developing unit 312, and the transfer unit 318 form an image forming unit. The laser beam printer 300 also includes a power supply apparatus 500 which corresponds to the switching power supply 100, 400 described in the embodiment 1, 2. An image forming apparatus to which the switching power supply 100, 400 of the embodiment 1, 2 is applicable is not limited to the image forming apparatus illustrated in FIG. 7. For example, the switching power supply 100, 400 of the embodiment 1, 2 may be applied to an image forming apparatus which includes a plurality of image forming units. Further, the switching power supply 100, 400 of the embodiment 1, 2 may be applied to an image forming apparatus which includes: a primary transfer unit configured to transfer a toner image on the photosensitive drum 311 to an intermediate transfer belt; and a secondary transfer unit configured to transfer the toner image on the intermediate transfer belt to a sheet.

The laser beam printer 300 includes a controller 320 which corresponds to the CPU 22 of the control unit 20 in the embodiment 1, 2. The laser beam printer 300 performs control of an image forming operation, performed by the image forming unit, and a sheet conveying operation. Power is supplied to the controller 320 from the power supply apparatus 500, which corresponds to the switching power supply 100, 400 described in the embodiment 1, 2, via the DC/DC converter 21 of the control unit 20 in the embodiment 1, 2. Further, the power supply apparatus 500, which corresponds to the switching power supply 100, 400 described in the embodiment 1, 2, supplies the power to drive units, such as motors, for rotating the photosensitive drum 311, and for driving various rollers and the like which convey a sheet. Further, when an AC voltage from an AC power supply drops causing the input voltage Vin to assume a low voltage state where the input voltage Vin is lower than a predetermined voltage, the power supply apparatus 500, which corresponds to the switching power supply 100, 400 described in the embodiment 1, 2, shifts a control mode from a normal control mode to a low voltage control mode. In the low voltage control mode, the power supply apparatus 500 performs control to allow the output voltage Vout to assume a voltage Vout2, that is, control where the DC/DC converter 21 of the control unit 20 in the embodiment 1, 2 halts outputting of the power supply voltage Vout3 and, as a result, an operation of the controller 320 is halted. When an AC voltage from the AC power supply is returned to a normal voltage in a normal state, thus bringing about a normal voltage state where the input voltage Vin is higher than the predetermined voltage, the power supply apparatus 500 shifts a control mode from a low voltage control mode to a normal control mode. In a normal control mode, the power supply apparatus 500 performs control so that the output voltage Vout is to be the voltage Vout1, that is, control where the DC/DC converter 21 of the control unit 20 in the embodiment 1, 2 outputs the power supply voltage Vout3 and, as a result, the controller 320 becomes operable.

As has been described above, according to this embodiment, in the low input voltage state, the output voltage of the switching power supply can be controlled to a low level. Further, power consumption of the low voltage detection circuit can be reduced, and responsiveness in detecting a voltage can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-209347, filed Oct. 30, 2017, which is hereby incorporated by reference herein in its entirety.

What is claimed is:

1. A power supply apparatus comprising:
  a rectifying and smoothing unit configured to rectify and smooth an AC voltage from an AC power supply to generate an input voltage;
  a transformer including a primary winding, a secondary winding, and an auxiliary winding to which the input voltage is supplied;
  a first switching element connected to the primary winding of the transformer;
  a feedback unit configured to output a feedback voltage corresponding to an output voltage induced in the secondary winding of the transformer;
  a voltage detection unit configured to detect a voltage corresponding to a voltage induced in the auxiliary winding of the transformer; and
  a control unit configured to perform control of an operation of the first switching element based on the feedback voltage and the voltage detected by the voltage detection unit, thus controlling the output voltage,
  wherein in a state where the voltage detected by the voltage detection unit is equal to or more than a first threshold voltage, the control unit shifts an operation to a first state where the control unit performs control of the first switching element so that the output voltage is to be a first output voltage based on the feedback voltage, and in a state where a voltage value of the AC power supply detected by the voltage detection unit is less than a second threshold voltage smaller than the first threshold voltage, the control unit shifts to a second state where the control unit performs control of the first switching element so that the output voltage is to be a second output voltage smaller than the first output voltage.

2. The power supply apparatus according to claim 1, wherein in the second state, the control unit performs an intermittent operation where a first period in which a switching operation of the first switching element is performed and a second period in which the switching operation of the first switching element is halted are alternately repeated so that the output voltage is controlled to be the second output voltage.

3. The power supply apparatus according to claim 2, wherein in the first period, the control unit performs turning-on and turning-off of the first switching element at least one time.

4. The power supply apparatus according to claim 3, wherein in the second state, the control unit detects a voltage value of the AC power supply with the voltage detection unit in the first period.

5. The power supply apparatus according to claim 1, wherein in the first state, the control unit performs control of turn-on duty of the first switching element based on the feedback voltage.

6. The power supply apparatus according to claim 1, wherein the power supply apparatus is a power supply apparatus capable of controlling the output voltage in proportion to turn-on duty of the first switching element, and
wherein in the second state, the control unit performs control of the turn-on duty of the first switching element to a low level so that the output voltage is to be the second output voltage.

7. The power supply apparatus according to claim 6, wherein in the first period in the second state, after the control unit performs control of the turn-on duty of the first switching element based on a detection result of the voltage detection unit, the voltage detection unit detects a voltage value of the AC power supply.

8. The power supply apparatus according to claim 6, wherein the first switching element is connected in series to a primary winding of the transformer, and
wherein the control unit performs, in the first state, control of the turn-on duty of the first switching element so that the output voltage is to be the first output voltage.

9. The power supply apparatus according to claim 8, comprising:
a second switching element connected in parallel to the primary winding of the transformer; and
a capacitor connected in series to the second switching element, and connected in parallel to the primary winding of the transformer together with the second switching element,
wherein the control unit sets the first switching element and the second switching element to an ON state and an OFF state alternately after a period where both the first switching element and the second switching element are in an OFF state, and
wherein the control unit performs control of the turn-on duty of the first switching element such that the output voltage is to be the first output voltage in the first state, and the output voltage is to be the second output voltage in the second state.

10. The power supply apparatus according to claim 1, wherein the voltage corresponding to a voltage induced in the auxiliary winding of the transformer corresponds to the input voltage.

11. An image forming apparatus comprising:
an image forming unit configured to perform image forming on a recording material; and
a power supply apparatus configured to supply power to the image forming apparatus,
wherein the power supply apparatus includes:
a rectifying and smoothing unit configured to rectify and smooth an AC voltage from an AC power supply to generate an input voltage;
a transformer including a primary winding, a secondary winding, and an auxiliary winding to which the input voltage is supplied;
a first switching element connected to the primary winding of the transformer;
a feedback unit configured to output a feedback voltage which corresponds to an output voltage induced in the secondary winding of the transformer;
a voltage detection unit configured to detect a voltage corresponding to a voltage induced in the auxiliary winding of the transformer; and
a control unit configured to perform control of an operation of the first switching element based on the feedback voltage and the voltage detected by the voltage detection unit, thus controlling the output voltage,
wherein in a state where the voltage detected by the voltage detection unit is equal to or more than a first threshold voltage, the control unit shifts to a first state where the control unit performs control of the first switching element, based on the feedback voltage, so that the output voltage is to be a first output voltage, and in a state where a voltage value of the AC power supply detected by the voltage detection unit is less than a second threshold voltage smaller than the first threshold voltage, the control unit shifts to a second state where the control unit performs control of the first switching element so that the output voltage is to be a second output voltage smaller than the first output voltage.

12. The image forming apparatus according to claim 11, wherein an operation mode of the image forming apparatus is switchable between a normal operation mode in which the AC voltage is a predetermined voltage and a low voltage operation mode in which the AC voltage has a value smaller on a side of the predetermined voltage according to the AC voltage from the AC power supply, and
the image forming apparatus is shifted to the second state in the low voltage operation mode.

13. The image forming apparatus according to claim 12, comprising a controller configured to perform control of an operation of the image forming unit,
wherein the power supply apparatus supplies power to the controller, and
wherein in the low voltage operation mode, the power supply apparatus halts supply of power to the controller.

14. The image forming apparatus according to claim 11, wherein the voltage corresponding to a voltage induced in the auxiliary winding of the transformer corresponds to the input voltage.

* * * * *